United States Patent [19]
Nicolaï

[11] Patent Number: 5,798,933
[45] Date of Patent: Aug. 25, 1998

[54] HIGH PRECISION RELATIVE DIGITAL VOLTAGE MEASUREMENT

[75] Inventor: Jean Nicolaï, Châteauneuf le Rouge, France

[73] Assignee: SGS-Thomson Microelectronics S.A., Gentilly, France

[21] Appl. No.: 667,192

[22] Filed: Jun. 20, 1996

[30] Foreign Application Priority Data

Jun. 21, 1995 [FR] France ............... 95 07674

[51] Int. Cl.[6] ....................................... G05F 1/08
[52] U.S. Cl. ............................. 364/483; 324/609
[58] Field of Search .................. 364/483; 324/609, 324/120; 340/825.06

[56] References Cited

U.S. PATENT DOCUMENTS

| | | | |
|---|---|---|---|
| 4,504,922 | 3/1985 | Johnson et al. | 364/557 |
| 5,008,865 | 4/1991 | Shaffer et al. | 368/10 |
| 5,420,798 | 5/1995 | Lin et al. | 364/483 |
| 5,442,794 | 8/1995 | Wisor et al. | 364/483 |

*Primary Examiner*—James P. Trammell
*Assistant Examiner*—Thomas Peeso
*Attorney, Agent, or Firm*—David V. Carlson; Seed and Berry LLP

[57] ABSTRACT

This device determines a quantity corresponding to a linear function of a voltage to be detected, and includes a circuit for charging with a determined time constant a capacitor, and a microcontroller. The microcontroller compares the voltage across the capacitor to a predetermined threshold and then resets the voltage across the capacitor. A counter counts the time duration between the end of a capacitor reset and the time when it reaches the predetermined threshold and calculates the inverse of said duration. This data can then be used to signal the end of a process, such as the proper charging of rechargeable batteries.

22 Claims, 1 Drawing Sheet

HIGH PRECISION RELATIVE DIGITAL VOLTAGE MEASUREMENT

BACKGROUND OF THE INVENTION

1. Field of the Invention

The present invention relates to a method and a device for determining a quantity corresponding to a voltage. It relates to applications in which the accurate detection of the variations of a voltage, and not of its absolute value, is desired.

2. Discussion of the Related Art

Such relative voltage measurements are for example useful in systems wherein the detection of the shape variation of a curve of voltage as a function of time is desired and wherein the cost of the measurement system is a major constraint.

A first example of such an application is that of infrared presence detectors or other detectors wherein the detection of a variation with respect to a control value is desired.

The invention will be discussed in the context of another application, that is, battery chargers, and more specifically chargers for charging nickel-cadmium (NiCd) or metallic nickel-hydride (NiMH) type batteries. In such chargers, it is desirable, for each charging process, to fully charge the battery but without exceeding a maximum charge which would prejudice the lifetime and the operation of the battery. In such batteries, this maximum charge level corresponds to the apparition of an inflection point in the curve of voltage variation as a function of time. This inflection point is detected by measuring at regular intervals the voltage across the battery during the charge, and by analyzing the evolution of the voltage variations. When passing from an area where the voltage variations are progressively increasing to an area where the voltage variations are progressively decreasing, the reaching of the inflection point has been detected. To carry out this measurement, two problems arise. First, the variations must be measured with great accuracy, for example about one thousandth, which corresponds to a digital measurement over 10 bits. Moreover, it can be desirable to use the same battery charger to charge various batteries including different numbers of cells. For example, if it is desired to be able to charge batteries including 3 to 8 cells, knowing that a cell voltage varies between 1 and 1.8 volts, it must be made possible to measure said variations around an average voltage which can be in a range of substantially 3 to 15 volts.

SUMMARY OF THE INVENTION

To achieve this object, the present invention provides a method for determining a quantity corresponding to a linear function of the voltage to be detected, including the steps of charging a capacitor with the voltage to be detected, with a predetermined time constant; determining the duration at the end of which the voltage across the capacitor reaches a predetermined threshold; and calculating the inverse of said duration, which corresponds to the value desired.

According to an embodiment of the present invention, this method includes several steps consisting in periodically performing inverse calculations and in calculating the difference between two successive inverses.

The present invention also provides a device for determining a quantity corresponding to a linear function of a voltage to be detected, including a circuit for charging with a determined time constant a capacitor and a microcontroller. The microcontroller includes means for comparing the voltage across the capacitor to a predetermined threshold; means for resetting the voltage across the capacitor; means for counting the time duration between the end of a capacitor reset and the time when it reaches the predetermined threshold; and means for calculating the inverse of said duration.

According to an embodiment of the present invention, the comparison means are constituted by an inverter.

The simplest way to perform these measurements is to use an analog-to-digital converter integrated in a microcontroller. If an accuracy of bout one thousandth is needed, an analog-to-digital converter with an accuracy of 10 bits or more thus has to be provided. Now, conventional low-cost microcontrollers such as microcontroller ST6 of SGS-Thomson Microelectronics (ST) are commonly associated with analog-to-digital converters with an accuracy of only 8 bits (1/250). On the other hand, these microcontrollers include a high frequency clock, counters and calculation means capable of providing accuracies of about 16 bits. Thus, the present invention aims at using a low-cost microcontroller for a relative voltage measurement by performing this measurement based on time counting instead of direct analog-to-digital conversion.

The foregoing and other objects, features and advantages of the present invention will be discussed in more detail in the following description of specific embodiments, taken in conjunction with the accompanying drawings, but not limited by them.

DETAILED DESCRIPTION

Figure 1:
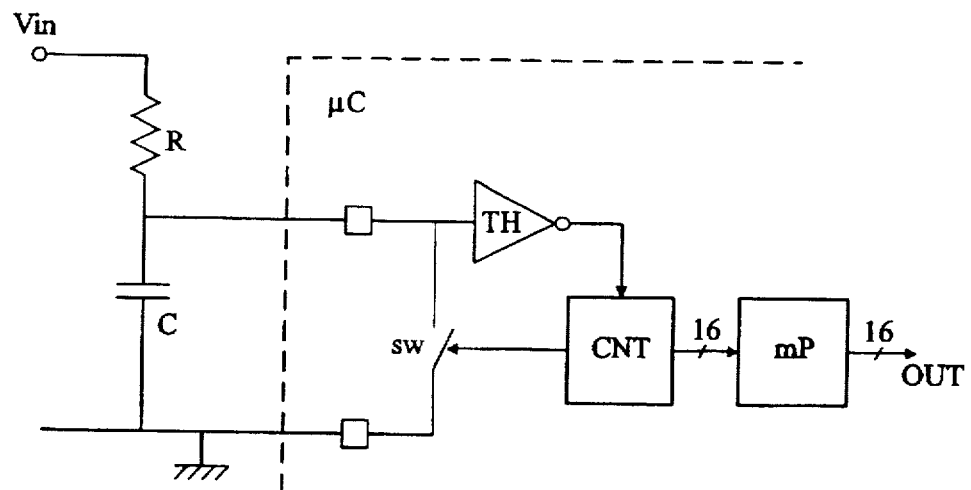
FIG. 1 shows a diagram of a circuit according to the present invention.

FIG. 1 shows a circuit according to the present invention. Given a voltage $V_{in}$ to be measured, this voltage is applied at the series connection of resistance R and capacitor C. The junction of the resistance and the first terminal of the capacitor is connected to the input of a threshold circuit TH, for example a plain inverter. The other capacitor terminal is connected to a reference potential, usually the ground. The reference potential is also connected to the threshold circuit input via a switch SW. Switch SW is controlled by any acceptable signal, such as an output of a counter CNT or a signal from the microprocessor or from some other source, so as to be opened at periodic intervals. Opening switch SW begins a charge cycle of capacitor C. Switch SW is closed as soon as the voltage across capacitor C has reached threshold $V_{th}$ of circuit TH. The counter output at the closing time is transmitted to a storage circuit or directly to an input of a microprocessor mP for processing. As will be seen hereafter, the processing mainly consists of an inverse calculation and the microprocessor supplying on its output OUT a digital datum proportional to the inverse of the counter count. The output of counter CNT and the output of microprocessor mP are preferably provided over 16 bits. The microprocessor will also be able, in cooperative relation with storage circuits, to measure and output differences between successive values of the inverse of the time intervals measured by the counter. Thus, the circuit very accurately determines voltage variations occurring at $V_{in}$ between periodic measurements.

As shown in FIG. 1, the circuit according to the present invention is particularly simple, since all the components, the threshold circuit TH, switch SW, counter CNT and microprocessor mP, are components which exist in a conventional low-cost microcontroller such as a microcontroller ST6. Within the microprocessor mP are storage registers for use as the storage circuit to permit storing subsequent time intervals for later comparison. The circuit according to the invention thus includes three components only, the microcontroller, resistance R and capacitor C. In fact, in most applications aimed at by the present invention, the microcontroller is not a component specific to the desired application since it is also generally used for other functions. The only material elements needed for the circuit according to the invention thus are resistance R and capacitor C.

Figure 2:
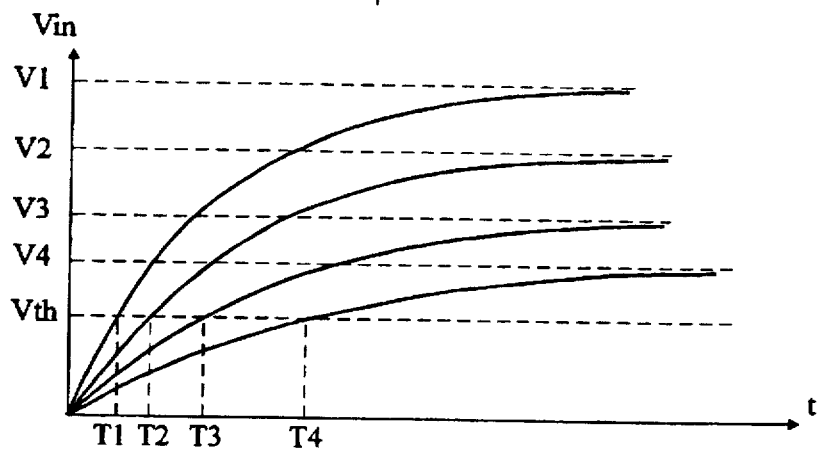
FIG. 2 shows the shape of the curve of capacitor charging as a function of time for various values of the voltage applied.

FIG. 2 shows curves of charge voltage of capacitor C as a function of time for various values V1, V2, V3, V4 of the voltage $V_{in}$, to be measured. These curves have an exponential shape and voltage $V_{th}$ will be reached in a time T1, T2, T3, T4 which is all the shorter as voltage $V_{in}$ is high. In a known manner, this time T is defined by the equation:

$$T/RC = -\ln[1-(V_{th}/V_{in})]$$

There is thus a logarithmic relation between time T and the voltage $V_{in}$ to be measured. This is probably why this measurement is usually not used.

Figure 3:
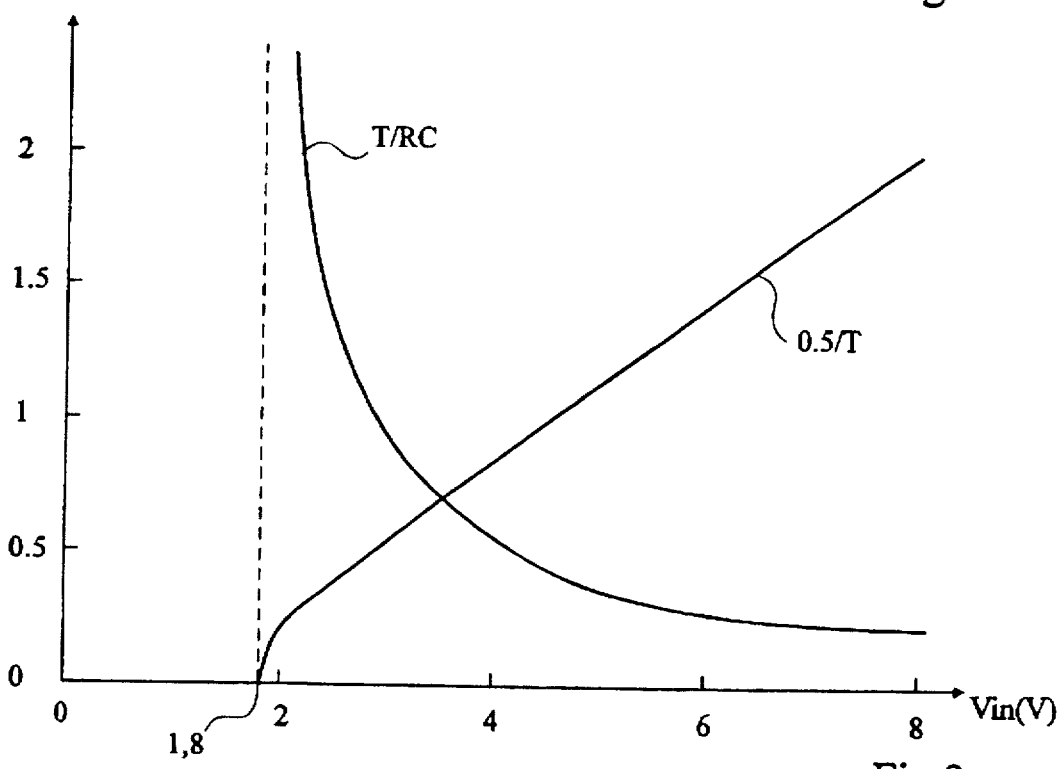
FIG. 3 shows T/RC and 0.5/T curves for various values of the input voltage ($V_{in}$).

Nevertheless, the inventor has plotted curves representing the inverse of time T as a function of input voltage $V_{in}$ for a threshold voltage of 1.8 volts, for example, as shown in FIG. 3, the 0.5/T curve. The curve appears to be practically linear as soon as the input voltage exceeds 4 volts and, in the range from 2 to 4 volts, the curve is not linear but has a continuous and low variation. Thus, the variations between values of 1/T are perfectly representative of the variations of input voltage $V_{in}$ around a given value of this voltage.

It should also be noticed that, since only variations in values are considered according to the present invention, and since an absolute measurement of voltage $V_{in}$ is not desired, it is not necessary to know the exact values of resistance R, capacitor C and threshold voltage $V_{th}$. It is sufficient that, in a given device, these values be stable in time (and even only inside relatively short time intervals).

The means for starting the counter and for programming the microprocessor to perform the desired calculations need not be discussed here, since such structure and these calculations are conventional and particularly easy. Moreover, since the microprocessor only has to perform calculations of inverses of counting data and of differences between successive calculated inverses, it should be noticed that such calculations are particularly simple and can be performed very fast without difficulty.

If, for example, a 15-bit counter (from 1 to 32,768) is chosen, the values of the resistance and of the capacitor will be chosen according to the threshold voltage of the threshold device so that the minimal voltage to measure (2 volts for a 1.8 volt threshold voltage) approximately corresponds to a maximum counting. An accuracy higher than one for one thousand is thus obtained even in high voltage ranges of about 10 to 15 volts for which the counting will be relatively limited, for example about 2,800 for a 10 volt input voltage as in the case of the above numerical example.

Of course, the present invention is likely to have various alterations, modifications and improvements which will readily occur to those skilled in the art, especially as concerns the realization of the elements used inside the microcontroller. Besides, other applications than that of a battery charger can be considered by those skilled in the art according to the problems that will be set to him.

Any counter that begins to count on the generation of a signal and ends the count on receiving a low going pulse from inverter and generates a switch close signal upon receiving the low going pulse TH is acceptable. The switch open signal can be generated by the counter itself or under control of the microprocessor or by some external circuit as can be easily implemented by those of skill in the art. The switch close signal can be obtained by use of a counter outputting a high going signal or a low going signal upon receiving a low going input.

Such alterations, modifications and improvements are intended to be part of this disclosure and are intended to be within the spirit and scope of the invention. Accordingly, the foregoing description is by way of example only and is not intended to be limiting. The invention is limited only as defined in the following claims and the equivalent thereto.

What is claimed is:

1. A method for determining a quantity corresponding to a linear function of a voltage to be detected, including the following steps:
    charging a capacitor with the voltage to be detected, with a determined time constant;
    determining the duration at the end of which the voltage across the capacitor reaches a predetermined threshold; and
    calculating the inverse of said duration, which corresponds to the quantity desired.

2. A method according to claim 1, including the following steps:
    periodically performing inverse calculations; and
    calculating the difference between two successive inverses.

3. A device for determining a quantity corresponding to a linear function of a voltage to be detected, including a circuit for charging with a determined time constant a capacitor, and a microcontroller including:
    means for comparing the voltage across the capacitor with a predetermined threshold;
    means for resetting the voltage across the capacitor;
    means for counting the time duration between the end of a capacitor reset and the time when it reaches the predetermined threshold; and
    means for calculating the inverse of said duration.

4. A device according to claim 3 wherein the comparison means are constituted by an inverter.

5. A voltage measurement circuit for detecting variations in a voltage comprising:
    an input voltage terminal connectable to a variable voltage source;
    a resistor coupled between said input voltage terminal and an intermediate node;
    a capacitive element coupled between said intermediate node and a reference potential terminal;
    an electrical circuit coupled in parallel with said capacitive element, said circuit having a counter circuit means for producing a time measurement for the voltage across the capacitor to reach a selected threshold; and
    a storage circuit for storing the value of successive time measurements made by the electrical circuit.

6. The voltage measurement circuit of claim 5 wherein said means for producing a relative voltage measurement of said input voltage further includes means for calculating the charge cycle time duration of said capacitive element.

7. The voltage measurement circuit of claim 5 wherein said electrical circuit includes a microcontroller having an analog-to-digital converter integrated therein.

8. The voltage measurement circuit of claim 5 wherein said input voltage is approximately between two and fifteen volts.

9. The voltage measurement circuit of claim 8 wherein said means for producing a relative voltage measurement of said input voltage further includes said relative voltage measurement having an accuracy greater than one one-thousandth of said input voltage.

10. The voltage measurement circuit of claim 5 wherein the electrical circuit further includes:
   a threshold circuit coupled to said intermediate node;
   a switch coupled between said intermediate node and said reference potential;
   a microprocessor; and
   a counter circuit coupled between said threshold circuit and said microprocessor, said counter circuit having means for controlling said switch.

11. The voltage measurement circuit of claim 5 wherein the resistor is serially coupled to said input voltage terminal.

12. The voltage measurement circuit of claim 5 wherein the electrical circuit includes means to perform inverse calculations.

13. The voltage measurement circuit of claim 12 wherein the inverter further includes means for comparing the capacitor voltage to a predetermined threshold voltage.

14. The voltage measurement circuit of claim 5 wherein the electrical circuit includes means for resetting the voltage across the capacitor.

15. The voltage measurement circuit of claim 3 wherein said means for resetting the voltage for resetting the voltage across the capacitor further includes means for calculating the time duration between the end of the capacitor reset and the time where the capacitor reaches a predetermined threshold voltage.

16. A method for measuring variations in a linear voltage function comprising:
   receiving a first input voltage;
   charging a storage circuit with said first input voltage to a predetermined threshold voltage, said storage circuit having a first time duration for reaching the predetermined threshold voltage;
   determining said first time duration at the end of which said predetermined threshold voltage of said storage circuit is reached;
   calculating a first inverse of the first determined time duration, wherein said first inverse is a quantity corresponding to a linear function of said first input voltage;
   receiving a second input voltage;
   charging said storage circuit with said second input voltage to said predetermined threshold voltage, said storage circuit having a second time duration for reaching the predetermined threshold voltage;
   determining said second-time duration at the end of which said predetermined threshold is reached;
   calculating a second inverse of the second determined time duration, wherein said second inverse is a quantity corresponding to a linear function of said second-input voltages;
   storing a variation between the value of the first inverse and the second inverse.

17. The method of claim 16 wherein the step of calculating the inverse of the determined time duration further includes performing said calculation periodically to develop a first and second inverse calculation.

18. The method of claim 17 further includes storing said first and second inverse calculation.

19. The method of claim 18 wherein the first storage circuit is a capacitor.

20. The method of claim 17 further includes the step of calculating the difference between said first and second inverse calculation.

21. The method of claim 16 further includes removing said input voltage from said capacitor after said threshold voltage is reached.

22. The method of claim 21 further includes resetting the voltage across the capacitor after said threshold voltage is reached and applying said input voltage to said storage circuit.

* * * * *